United States Patent [19]

Huang

[11] Patent Number: 4,997,812

[45] Date of Patent: Mar. 5, 1991

[54] SUPERCONDUCTING THICK FILM

[75] Inventor: Rong F. Huang, Albuquerque, N. Mex.

[73] Assignee: Motorola, Inc., Schaumburg, Ill.

[21] Appl. No.: 242,993

[22] Filed: Sep. 12, 1988

[51] Int. Cl.$^5$ ................................................ B32B 3/00
[52] U.S. Cl. ........................................ 505/1; 505/701; 505/702; 505/703; 505/704; 428/688; 428/701; 428/930; 427/62
[58] Field of Search ............... 29/599; 428/688, 930, 428/699, 700, 901; 505/1, 700-704; 427/62

[56] References Cited

U.S. PATENT DOCUMENTS 4,826,808  5/1989  Yurok et al. ............................ 505/1

OTHER PUBLICATIONS

Preparation of Superconducting Y—Ba—Cu—O Rock Film, Itoh et al., Japanese Journ. Appl. Phys., 27(3), Mar. 1988, pp. L-420-L-422.

Primary Examiner—Patrick Ryan
Attorney, Agent, or Firm—Joseph P. Krause; Steven G. Parmelee; Anthony J. Sarli

[57] ABSTRACT

An Ytrium Barium Copper Oxide-based thick-film paste is disclosed, which when deposited on an alumina substrate is superconducting above the termperature of liquid nitrogen and substantially free of mechanical defects such as cracking or peeling. A method of applying the paste, including the curing process, insures that the YBC superconductor is boned to the substrate.

1 Claim, 1 Drawing Sheet

SUPERCONDUCTING THICK FILM

BACKGROUND OF THE INVENTION

This invention relates to superconductors. In particular, this invention relates to superconductors which are disposed on ceramic-type substrates, such as alumina. These superconductors, when disposed onto a substrate, might be electrical circuit elements themselves, such as stripline filters, or, might be simple electrical circuit paths.

In electronic packaging, electronic components are frequently mounted on planar ceramic substrates made from alumina, $Al_2O_3$, with interconnections between the components being formed from a conductive thick film material deposited onto the substrate. These ceramic substrates are frequently used as carriers of electronic parts because of their cost, electrical properties and mechanical properties.

Interconnections between electronic devices mounted on ceramic substrates, in the prior art, have been principally made by depositing a paste onto the substrate, (the paste having conductive constituents which when suitably processed leaves a conductive path on the substrate), curing the paste and substrate and attaching the components appropriately. In many applications the conventional conductors used to connect components on ceramic substrates may have undesirable physical properties. For example, at high frequencies, skin effect losses attributable to the interconnection material increases substantially.

It has been known that certain materials' electrical resistivity goes to zero or nearly zero at a predetermined temperature known in the art as the transition temperature. Some recently discovered materials, such as Ytrium Barium Copper Oxide, or YBC, ($YBa_2Cu_3O_x$) for example, demonstrate this so called superconductivity at relatively high temperatures, i.e., at or near 93 degrees Kelvin. Because these materials can demonstrate a near zero electrical resistance, at or below their transition temperature, it might be desirable, in certain applications, to use a superconductor material on a ceramic substrate for purposes of reducing electrical losses.

Depositing superconductors such as YBC onto an alumina substrate and maintaining the superconductors' ability to superconduct at temperatures above the temperature of liquid nitrogen has proven to be difficult. Previously, superconductors deposited onto a ceramic substrate such as alumina, which is widely used as a substrate, have been difficult to bond to the alumina, and, when thermally cycled, have sustained mechanical failures such as cracking and peeling away from the substrate to such an extent that the conductive path on the substrate is not usable. Other superconducting materials when deposited on a ceramic substrate such as alumina might have been "poisoned" by the ceramic such that the superconducting transition temperature changes or superconducting behavior disappears.

It is therefore an object of the present invention to provide a method of depositing a superconductor onto a ceramic substrate such as alumina such that the superconductor when deposited, is mechanically stable and free of mechanical defects in that it does not pull away from the ceramic substrate, crack, or sustain other mechanical failures. Another object of the present invention is to provide a superconductor which when deposited on a ceramic substrate is not poisoned by the ceramic material and continues to demonstrate superconductivity at temperatures above 77 degrees kelvin.

SUMMARY OF THE INVENTION

To achieve the foregoing objects of the present invention there is provided a paste for application onto a ceramic substrate that when applied to an alumina substrate and cured, provides a mechanically stable superconducting path. The paste is comprised of the superconductor, YBC, which superconducts at approximately 93 degrees Kelvin, ($YBa_2Cu_3O_x$ with x between 6.8 and 6.9 for YBC to superconduct at approximately 93 degrees Kelvin.) and a stabilizing agent which acts to improve bonding of the YBC to the ceramic substrate, the stabilizing agent in the form of silver or silver oxide (either $Ag_2O$ or $AgO$). There is also provided the method of depositing a superconductor onto a ceramic substrate which remains mechanically stable. The method is comprised of the steps of: forming a paste of the superconductor, applying the paste to a ceramic substrate such as alumina; and curing the paste on the substrate.

DETAILED DESCRIPTION OF THE PREFERRED EMBODIMENT

Figure 1:
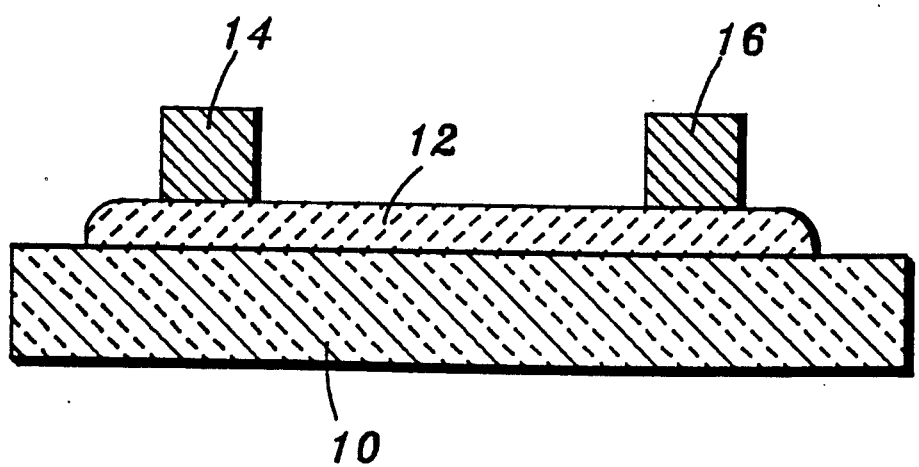
FIG. 1 shows a representative cross sectional view of a superconducting thick film layer deposited on a ceramic substrate.

FIG. 1 shows a schematic cross-sectional view of a simple circuit comprised of ceramic substrate 10 with a superconducting film 12 deposited onto substrate 10 with the film 12 acting as an interconnection between two packages 14 and 16. Packages 14 and 16 are shown to illustrate layer 12 as a conductive path between packages 14 and 16. Packages 14 and 16 might be any type of device mountable onto a ceramic substrate, such as any resistive, capacitive or inductive elements.

The substrate 10 as shown in the figure and contemplated in the preferred embodiment is an alumina, $Al_2O_3$, substrate. In the preferred embodiment of the invention, the superconductor 12 is deposited onto the substrate 10 by a series of steps.

A paste to be applied to the substrate is mixed which contains four components: the superconductor YBC; a stabilizing agent in the form of silver or silver oxide, (silver oxide as either $Ag_2O$ or $AgO$); a binding agent known as ethylcellulose resin; and a solvent known as terpineol. After mixing the paste, it is applied to the substrate. The preferred method of depositing the paste onto the substrate is screen printing, although other methods such as painting or dipping might similarly be used as well. The final step of the process is curing the paste after it is deposited on the substrate to insure that the binding agent and solvent substances of the paste are burned off, the paste adheres to the substrate and sufficient amounts of oxygen bond with the superconductor YBC to insure that it demonstrates its superconductivity at a sufficiently high transition temperature.

The paste in the preferred embodiment is comprised of a powdered form of YBC. Mixed with the YBC powder is a predetermined amount of powdered silver oxide. In the preferred embodiment silver oxide is mixed with YBC in an amount between 10 to 20 percent of the weight of the YBC, an amount of silver oxide which was found to produce mechanically stable bonding of the YBC to the alumina. When mixed with the YBC, the Silver Oxide is believed to act as a stabilizing agent which inhibits the formation of cracks, peeling of the YBC away from the ceramic substrate and the development of other mechanical defects in the YBC, which otherwise occur during the curing process and after thermal cycling when using conventional YBC material alone. The silver oxide may also act to provide oxygen to the YBC during the curing process which helps preserve the superconductivity effect of YBC.

It should be noted that the Silver Oxide could be used in lesser amounts, in amounts as low as 5 weight percent, to reduce the possibility of affecting the transition temperature of the superconductor by the Silver Oxide. Increasingly large amounts of Silver Oxide in the YBC can affect the ability of the YBC to superconduct electrical current.

To form the paste, a liquid slurry is first mixed by separately mixing the binding agent, ethylcellulose resin, with the solvent terpineol. In the preferred embodiment the binding agent, ethylcellulose resin, is mixed with the terpineol in a ratio of 10 weight percent binder to the terpineol. Both binder and solvent are thoroughly mixed to form this slurry. The binding agent serves only to glue or bind the superconductor YBC and silver oxide to the ceramic substrate. The solvent is required to establish the viscosity of the paste which is intended to be screened printed on to the substrate.

The YBC powder and silver oxide powder, which are mixed separately and added to the slurry, are added in a ratio of 3 parts of the mixture of YBC powder and silver oxide powder, to 1 part of the mixture of binder and solvent to form the paste. All four constituents are mixed using a three roller mill, as it is known in the art, to produce the thick film paste which may then applied to the ceramic using any appropriate method, including screen printing, painting or dipping.

In the preferred embodiment the ceramic substrate that was used was alumina, $Al_2O_3$. This material as well as any other material having similar mechanical and electrical characteristics could be used as a substrate.

The final step of the method of depositing a superconductor onto a substrate as contemplated by the invention is a curing process which causes the thick film paste to be properly bonded to the ceramic substrate. After depositing the paste onto the substrate, the paste and substrate are heated in the presence of oxygen at a pressure of approximately 1 atmosphere, to a temperature of between 325-375 degrees centigrade to burn off the solvent and binder.

After the initial heating of the paste and substrate at 325-375 degrees centigrade the temperature is increased at a steady rate of approximately 50 degrees per hour to a first intermediate temperature of approximately 475 degrees centigrade. This increase in temperature is also done in the presence of oxygen, at 1 atmosphere pressure and at a relatively slow rate to insure that sufficient oxygen combines with the YBC, and that whatever binder might remain in the paste is burned off. Failure to properly burn off the solvent and binder might inhibit the superconducting effect of the YBC.

After having reached approximately 475 degrees centigrade the temperature of the paste and substrate is again increased to a final temperature of approximately 975 degrees centigrade again at a steady rate of approximately 100 to 150 degrees Centigrade per hour, again in the presence of oxygen at approximately 1 atmosphere and held at the final temperature of 975 degrees centigrade for a period of approximately 0.5-4 hours, depending upon the film thickness. The paste is fired or bonded to the ceramic substrate at this temperature. The temperature and length of time at which it is fired must be sufficiently high and sufficiently long to insure that the paste is sufficiently bonded to the ceramic substrate.

After having been fired the temperature of the paste and substrate is reduced, again in the presence of oxygen at approximately one atmosphere to a third temperature of approximately 650 degrees centigrade at a rate of 100 degrees centigrade per hour. This permits the YBC to absorb sufficient amounts of oxygen to insure that it will properly superconduct when cool. Paste and substrate are cooled at a rate of 50 degrees centigrade per hour from 650 to 450, again in the presence of oxygen to insure that the YBC absorbs sufficient amounts of it.

After having obtained the temperature of 450 degrees centigrade the paste and substrate may be cooled at any desired rate to room temperature.

Using the foregoing preferred method and constituents of the paste, films deposited on an alumina substrate did not develop cracks as have been noted with prior art methods and pastes. Moreover, the YBC continued to demonstrate superconductivity when cooled to the YBC's transition temperature of 93 degrees Kelvin. Temperature cycling between room temperature and the temperature of liquid nitrogen have been performed without mechanical break-down of the bond between the ceramic substrate and the superconducting film.

I claim:

1. A substrate, having a mechanically stable YBC conductive path formed onto said substrate, said path formed by the process of:
   A. forming a paste comprised of:
      i. YBC powder;
      ii. a stabilizing material of $Ag_2O$ between 5 weight percent and 20 weight percent of said YBC powder;
      iii. a binding agent;
      iv. a solvent agent;
   B. disposing said paste onto said substrate;
   C. curing said paste onto said substrate.

* * * * *